(12) United States Patent
Nishihata et al.

(10) Patent No.: US 11,302,513 B2
(45) Date of Patent: Apr. 12, 2022

(54) ELECTRON MICROSCOPE APPARATUS, INSPECTION SYSTEM USING ELECTRON MICROSCOPE APPARATUS, AND INSPECTION METHOD USING ELECTRON MICROSCOPE APPARATUS

(71) Applicant: Hitachi High-Tech Corporation, Tokyo (JP)

(72) Inventors: Takahiro Nishihata, Tokyo (JP); Mayuka Osaki, Tokyo (JP); Takuma Yamamoto, Tokyo (JP); Akira Hamaguchi, Tokyo (JP); Yusuke Iida, Tokyo (JP); Chihiro Ida, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/042,290

(22) PCT Filed: Apr. 5, 2019

(86) PCT No.: PCT/JP2019/015148
§ 371 (c)(1),
(2) Date: Sep. 28, 2020

(87) PCT Pub. No.: WO2019/194304
PCT Pub. Date: Oct. 10, 2019

(65) Prior Publication Data
US 2021/0012998 A1    Jan. 14, 2021

(30) Foreign Application Priority Data
Apr. 6, 2018 (JP) .............................. JP2018-073716

(51) Int. Cl.
*H01J 37/22* (2006.01)
*G06T 7/70* (2017.01)
(Continued)

(52) U.S. Cl.
CPC .......... *H01J 37/222* (2013.01); *G01N 23/203* (2013.01); *G06T 7/0002* (2013.01);
(Continued)

(58) Field of Classification Search
CPC ........ H01J 37/222; H01J 37/244; H01J 37/26; H01J 2237/2445; H01J 2237/281;
(Continued)

(56) References Cited

U.S. PATENT DOCUMENTS 4,767,926 A * 8/1988 Murakoshi ............. G01B 15/00
250/310
5,212,028 A * 5/1993 Fujino ..................... G03F 7/265
430/22
(Continued)

FOREIGN PATENT DOCUMENTS

JP      S631910 A       1/1988
JP      H04149944 A     5/1992
(Continued)

OTHER PUBLICATIONS

International Preliminary Examination Report dated Jun. 25, 2020 in corresponding International Application No. PCT/JP2019/015148.
(Continued)

*Primary Examiner* — David A Vanore
(74) *Attorney, Agent, or Firm* — Miles & Stockbridge, P.C.

(57) ABSTRACT

An electron microscope apparatus includes a detection unit that detects reflected electrons reflected from a sample when the sample is irradiated with primary electrons emitted by a primary electron generation unit (electron gun), an image generation unit that generates an image of a surface of the sample with the reflected electrons based on output from the detection unit, and a processing unit that generates a differ-
(Continued)

ential waveform signal of the image generated by the image generation unit, processes the image by using information of the differential waveform signal, and measures a dimension of a pattern formed on the sample.

8 Claims, 17 Drawing Sheets

(51) Int. Cl.
*G01N 23/203* (2006.01)
*H01J 37/244* (2006.01)
*G06T 7/00* (2017.01)
*G06T 11/00* (2006.01)
*H01J 37/26* (2006.01)

(52) U.S. Cl.
CPC ............... *G06T 7/70* (2017.01); *G06T 11/00* (2013.01); *H01J 37/244* (2013.01); *H01J 37/26* (2013.01); *G01N 2223/053* (2013.01); *G01N 2223/401* (2013.01); *G01N 2223/505* (2013.01); *G01N 2223/611* (2013.01); *G06T 2207/10061* (2013.01); *G06T 2207/30168* (2013.01); *H01J 2237/2445* (2013.01)

(58) Field of Classification Search
CPC ..... H01J 2237/2443; H01J 37/22; G06T 7/70; G06T 7/0002; G06T 11/00; G06T 2207/10061; G06T 2207/30168; G06T 7/62; G01N 23/203; G01N 2223/053; G01N 2223/401; G01N 2223/505; G01N 2223/611; G01B 15/00; G01B 15/04
See application file for complete search history.

(56) References Cited

U.S. PATENT DOCUMENTS

| | | | |
|---|---|---|---|
| 5,412,210 A | 5/1995 | Todokoro et al. | |
| 5,434,409 A * | 7/1995 | Tsubusaki | G01B 15/04 250/307 |
| 5,493,403 A * | 2/1996 | Nishi | G03F 9/70 356/401 |
| 5,552,602 A | 9/1996 | Kakibayashi et al. | |
| 5,831,273 A * | 11/1998 | Someda | B82Y 10/00 250/492.22 |
| 5,912,467 A * | 6/1999 | Okino | H01J 37/3045 250/491.1 |
| 5,912,469 A * | 6/1999 | Okino | H01J 37/304 250/492.23 |
| 6,399,945 B1 * | 6/2002 | Hirayanagi | H01J 37/244 250/310 |
| 6,734,429 B2 | 5/2004 | Takagi | |
| 6,946,656 B2 | 9/2005 | Ezumi et al. | |
| 7,483,560 B2 * | 1/2009 | Shishido | G06T 7/0004 382/145 |
| 8,481,934 B2 | 7/2013 | Ezumi et al. | |
| 8,788,242 B2 | 7/2014 | Matsuoka et al. | |
| 9,472,376 B2 * | 10/2016 | Yokosuka | G01B 15/04 |
| 2005/0173633 A1 * | 8/2005 | Tanaka | G01N 23/2251 250/311 |
| 2006/0002604 A1 * | 1/2006 | Sakai | G06T 7/001 382/141 |
| 2006/0202119 A1 | 9/2006 | Yamada et al. | |
| 2008/0203298 A1 | 8/2008 | Ishijima et al. | |
| 2009/0212215 A1 * | 8/2009 | Nagatomo | G01N 23/225 250/311 |
| 2009/0214103 A1 * | 8/2009 | Tanaka | G06T 7/001 382/145 |
| 2012/0037801 A1 * | 2/2012 | Mochizuki | G01B 15/00 250/306 |
| 2012/0126116 A1 * | 5/2012 | Tanaka | G01B 15/04 250/307 |
| 2012/0305767 A1 | 12/2012 | Toyoda et al. | |
| 2013/0216141 A1 * | 8/2013 | Ushiba | G06K 9/3241 382/218 |
| 2014/0021348 A1 | 1/2014 | Hoque et al. | |
| 2014/0070099 A1 * | 3/2014 | Aliman | H01J 37/26 250/307 |
| 2014/0175279 A1 | 6/2014 | Agemura | |
| 2014/0217274 A1 | 8/2014 | Wang et al. | |
| 2016/0035538 A1 | 2/2016 | Fukuda | |
| 2016/0117847 A1 * | 4/2016 | Pandev | G01N 21/956 348/87 |
| 2016/0307730 A1 * | 10/2016 | Namai | H01J 37/28 |
| 2016/0379798 A1 | 12/2016 | Shishido et al. | |
| 2018/0033588 A1 | 2/2018 | Kumamoto et al. | |
| 2018/0182595 A1 * | 6/2018 | Yokosuka | G03F 7/70625 |
| 2019/0362933 A1 | 11/2019 | Takagi et al. | |
| 2021/0012998 A1 * | 1/2021 | Nishihata | H01J 37/244 |
| 2021/0027455 A1 * | 1/2021 | Kimizuka | H01J 37/28 |
| 2021/0043420 A1 * | 2/2021 | Ohashi | H01J 37/244 |

FOREIGN PATENT DOCUMENTS

| | | |
|---|---|---|
| JP | 2003157790 A | 5/2003 |
| JP | 2006119133 A | 5/2006 |
| JP | 2008218014 A | 9/2008 |
| JP | 2010175249 A | 8/2010 |
| JP | 201330277 A | 2/2013 |
| JP | 201333671 A | 2/2013 |
| JP | 201345500 A | 3/2013 |
| JP | 5313939 B2 | 10/2013 |
| JP | 2014130077 A | 7/2014 |
| JP | 5619118 B2 | 11/2014 |
| JP | 2015-106530 A | 6/2015 |
| JP | 2017103363 A | 6/2017 |

OTHER PUBLICATIONS

Search Report dated Jun. 25, 2020 in corresponding International Application No. PCT/JP2019/015148.
Written Opinion dated Jun. 25, 2020 in corresponding International Application No. PCT/JP2019/015148.
Search Report dated Jun. 25, 2020 in corresponding International Application No. PCT/JP2019/015151.
Written Opinion dated Jun. 25, 2020 in corresponding International Application No. PCT/JP2019/015151.

* cited by examiner

[FIG. 1A]
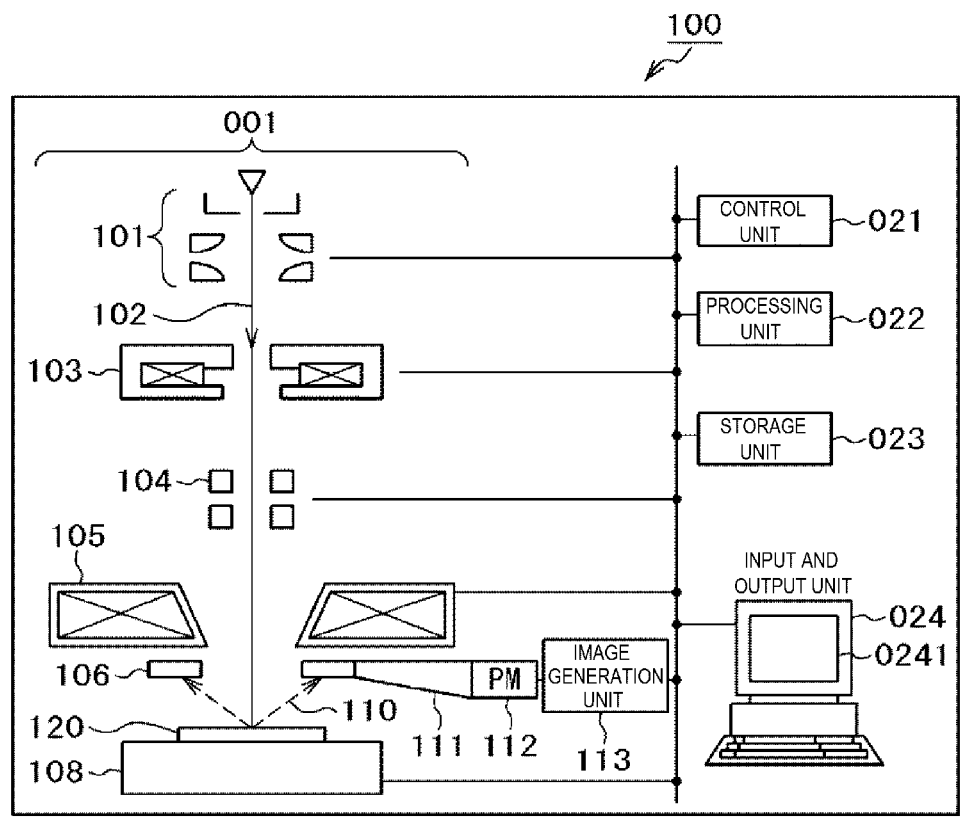
[FIG. 1B]
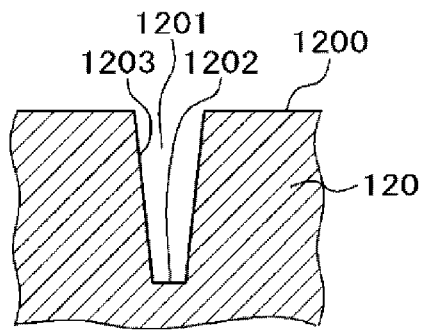

[FIG. 2]
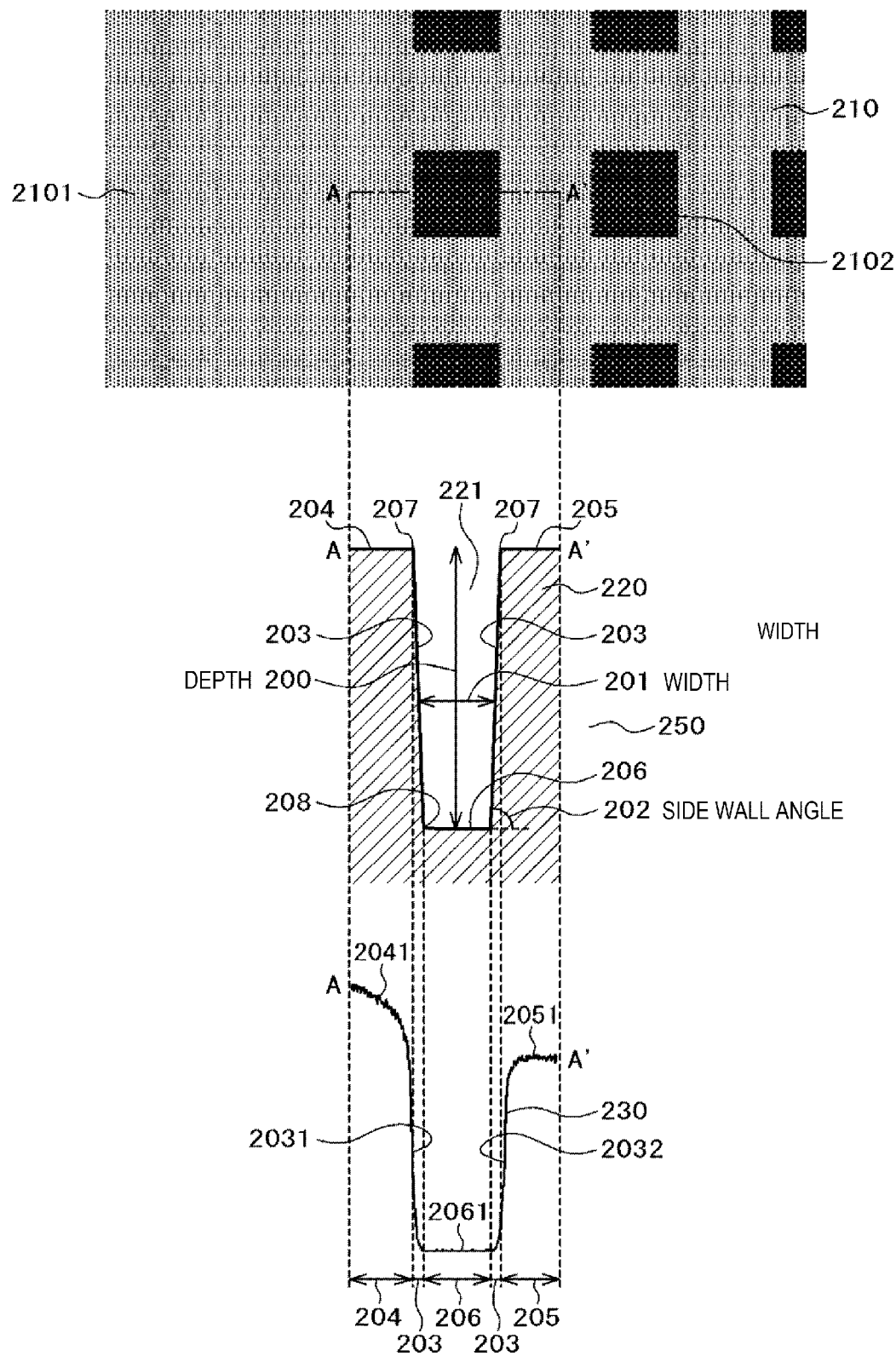

[FIG. 3]
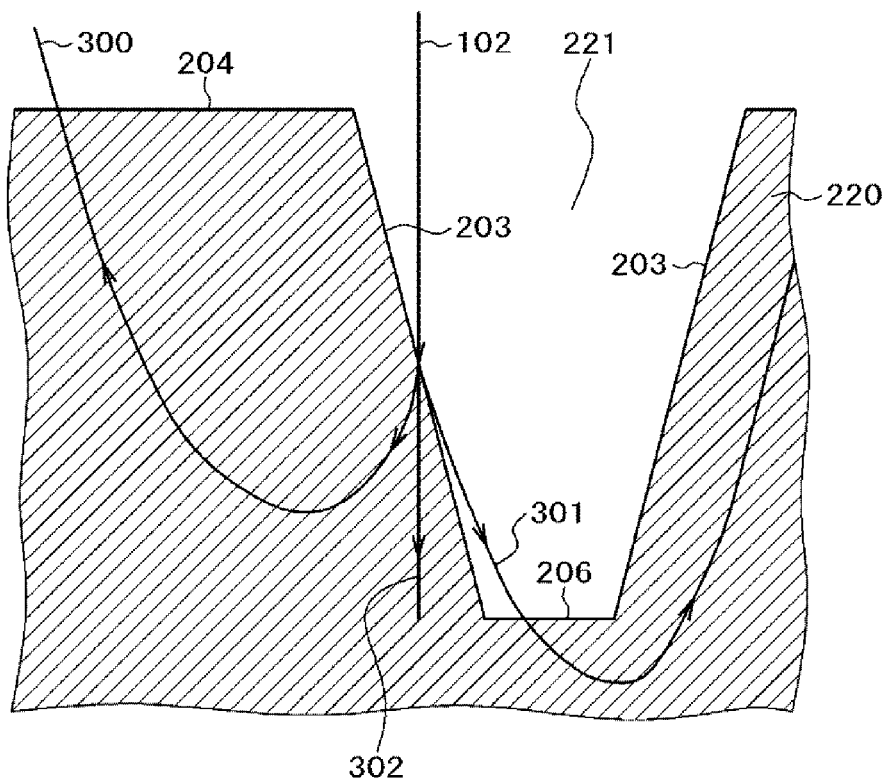
[FIG. 4A]
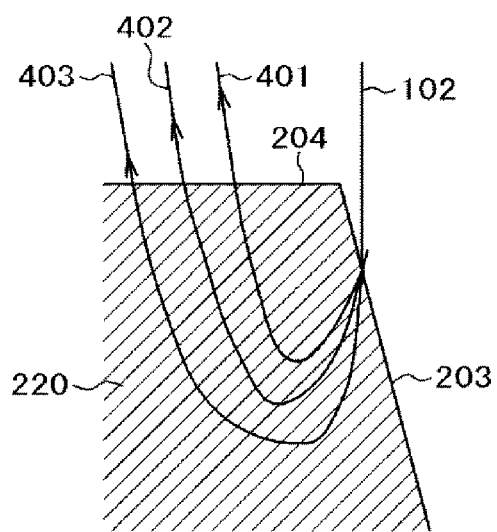

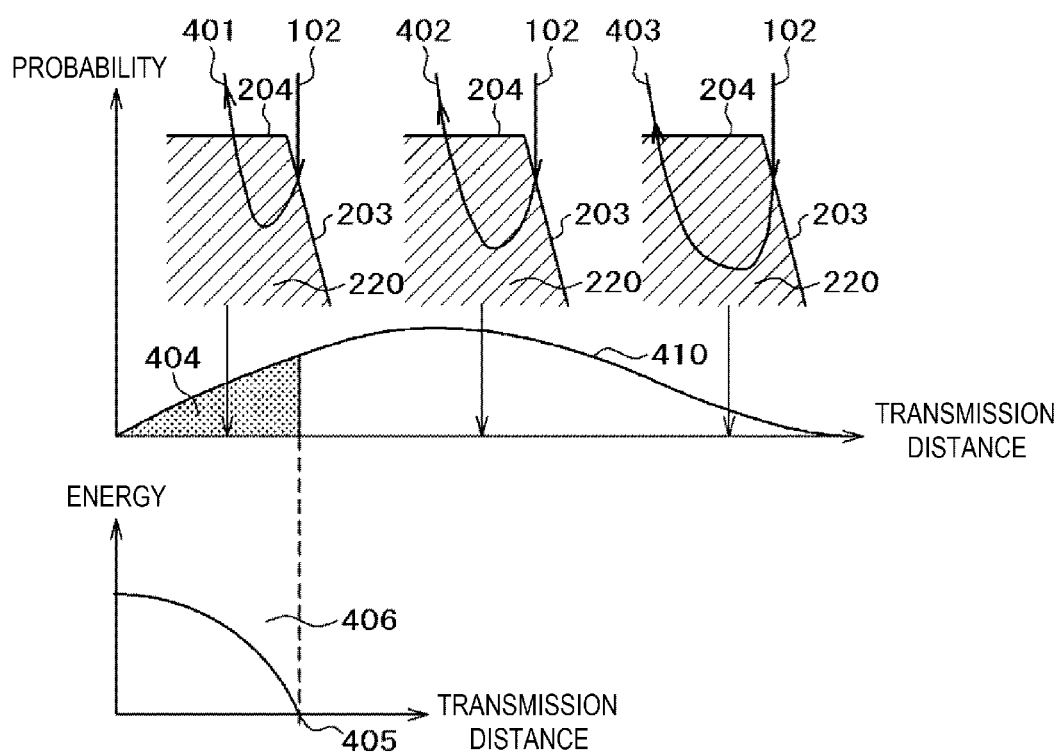
[FIG. 4B]

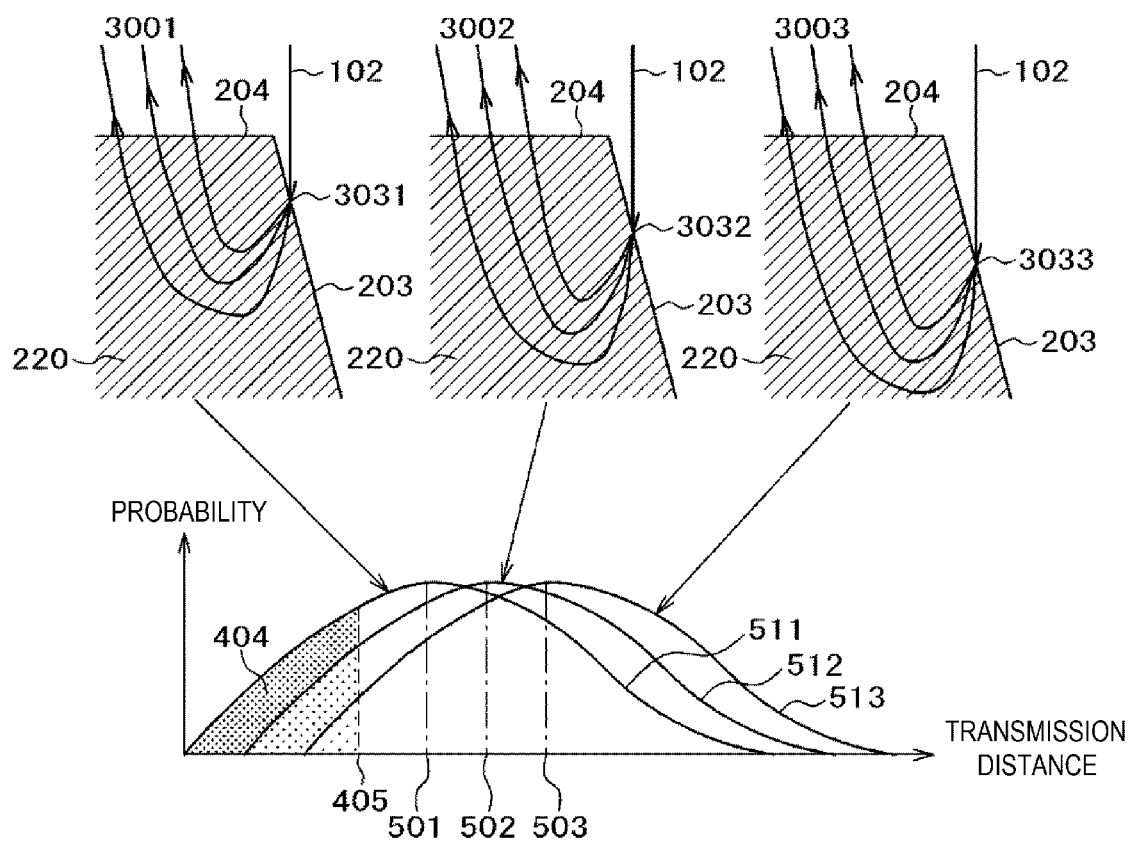
[FIG. 5]

[FIG. 6A]
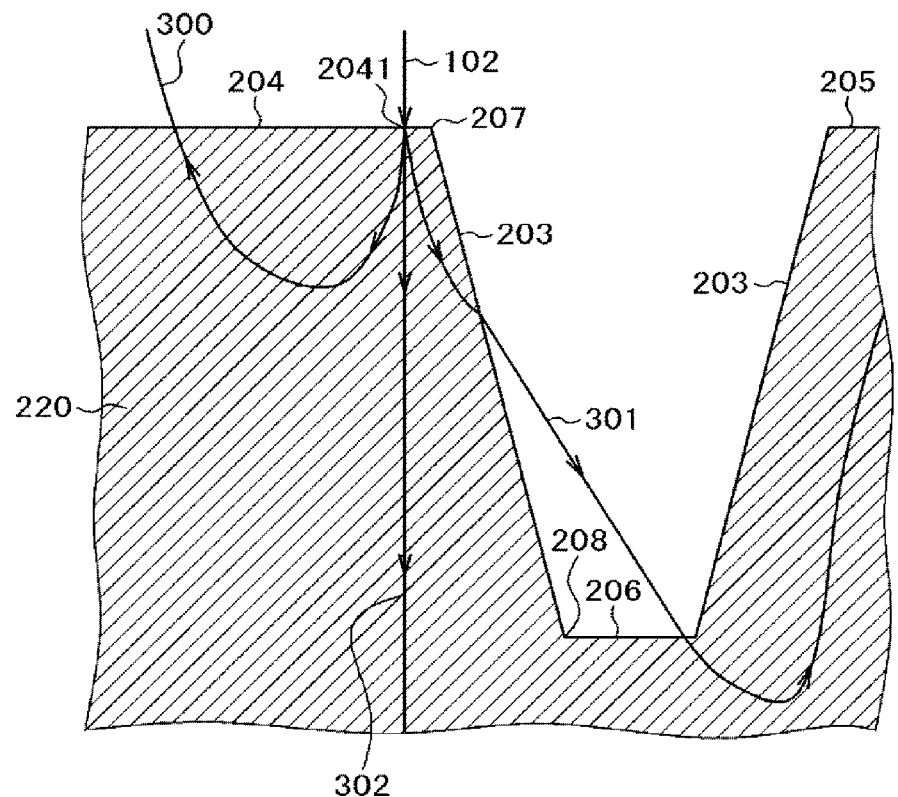
[FIG. 6B]
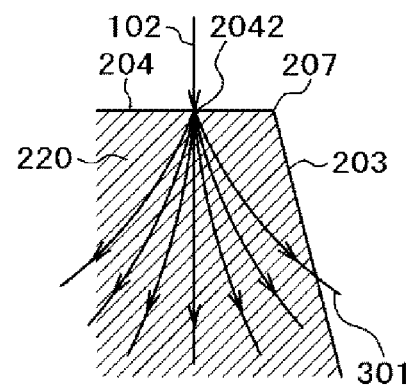

[FIG. 6C]
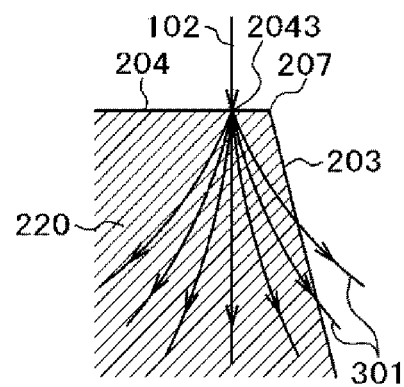
[FIG. 6D]
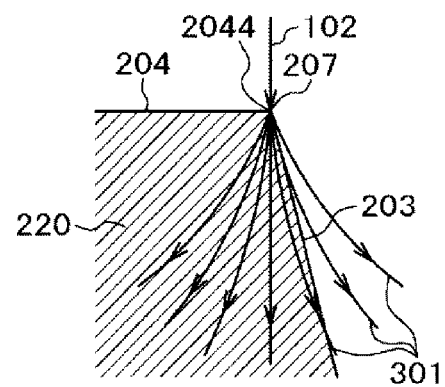

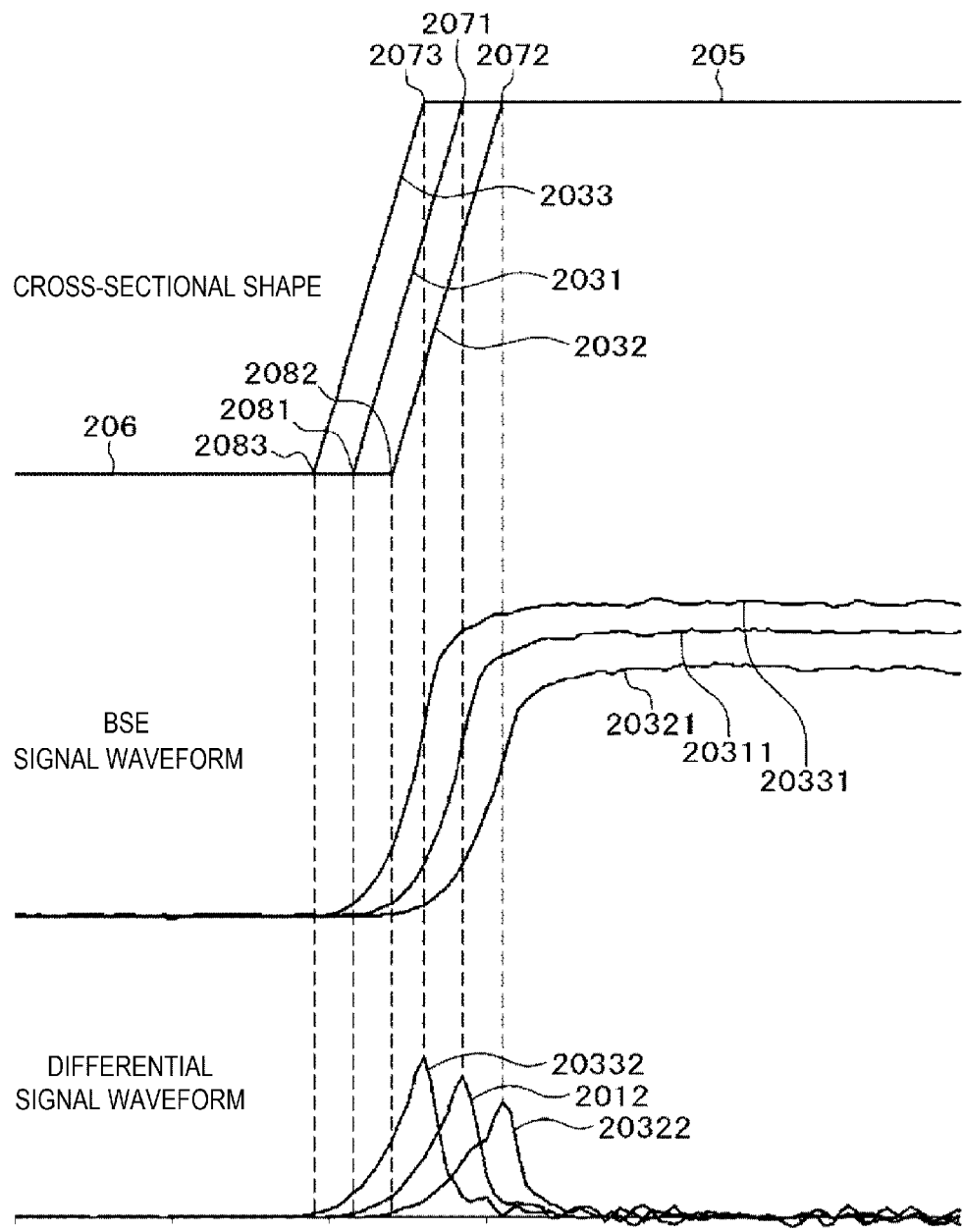

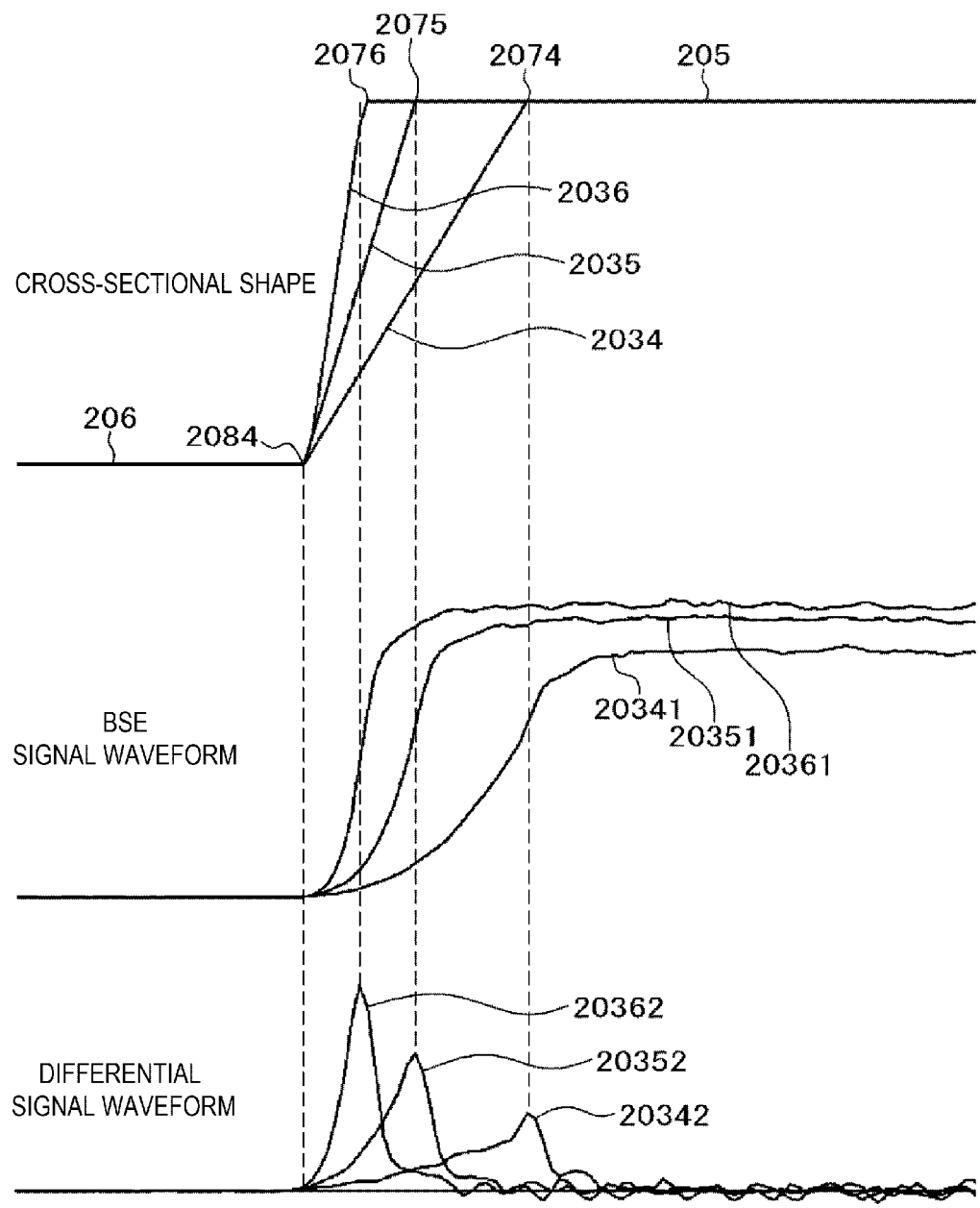

[FIG. 8A]
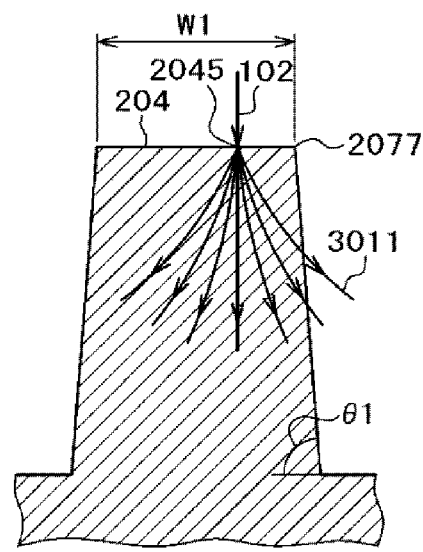
[FIG. 8B]
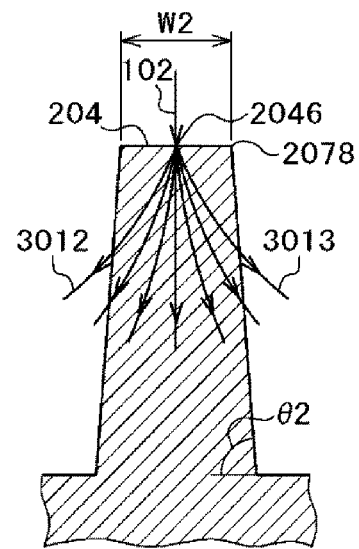

[FIG. 8C]
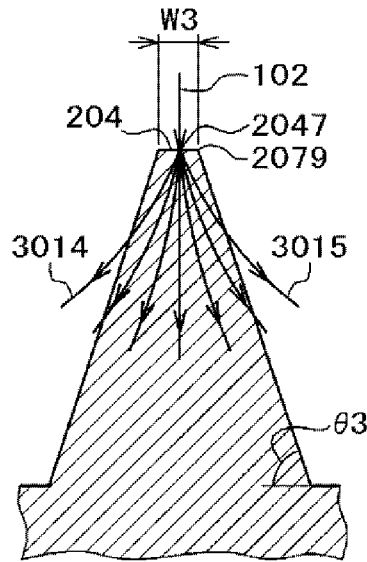
[FIG. 9A]
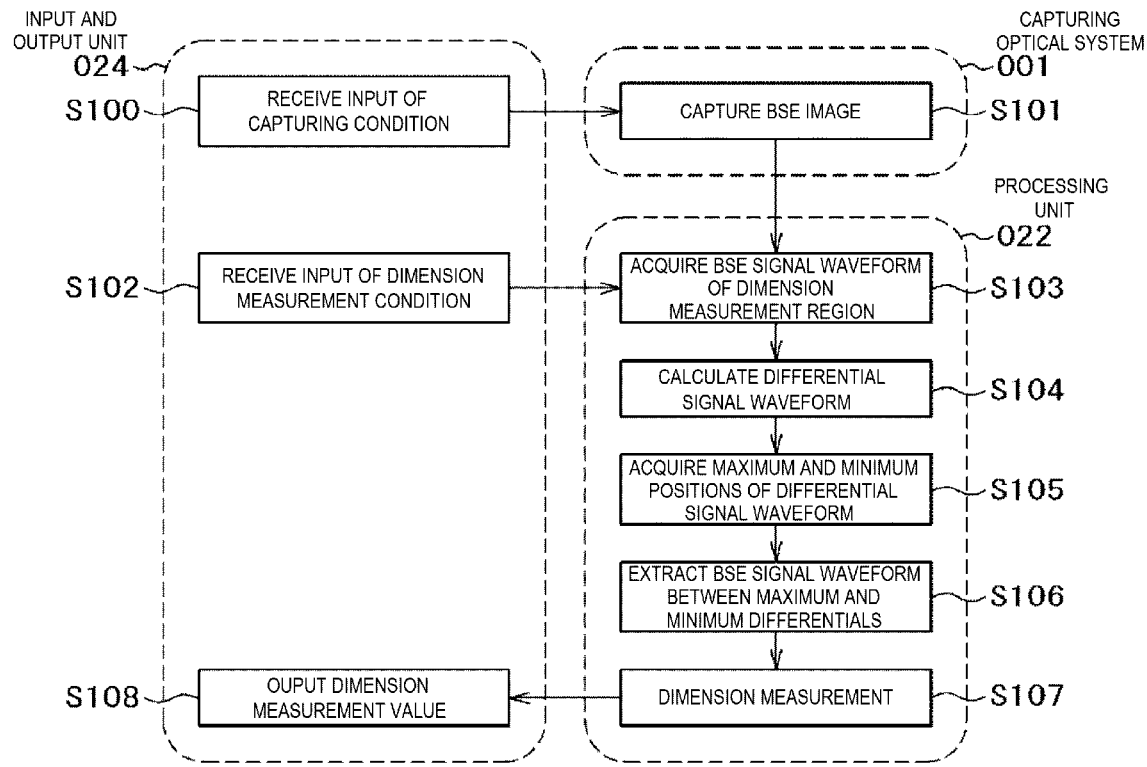

[FIG. 9B]
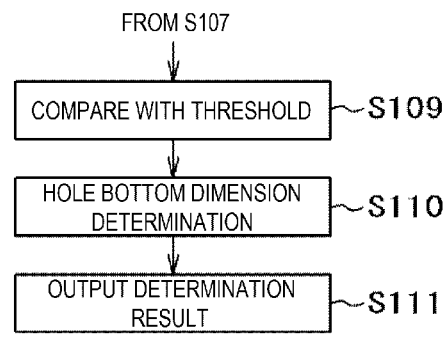
[FIG. 10]
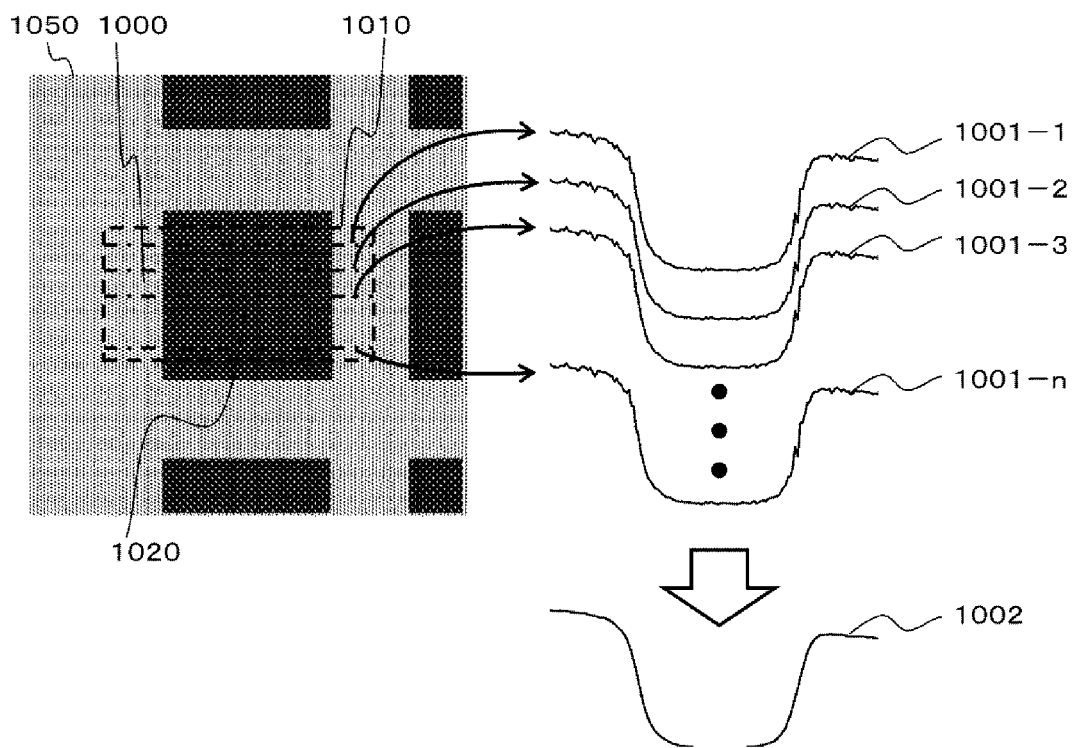

[FIG. 11]
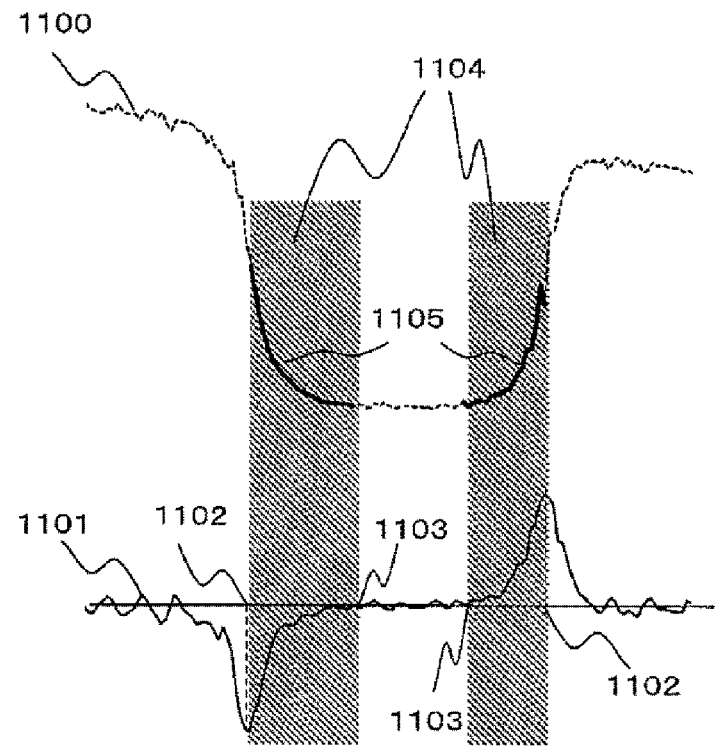
[FIG. 12]
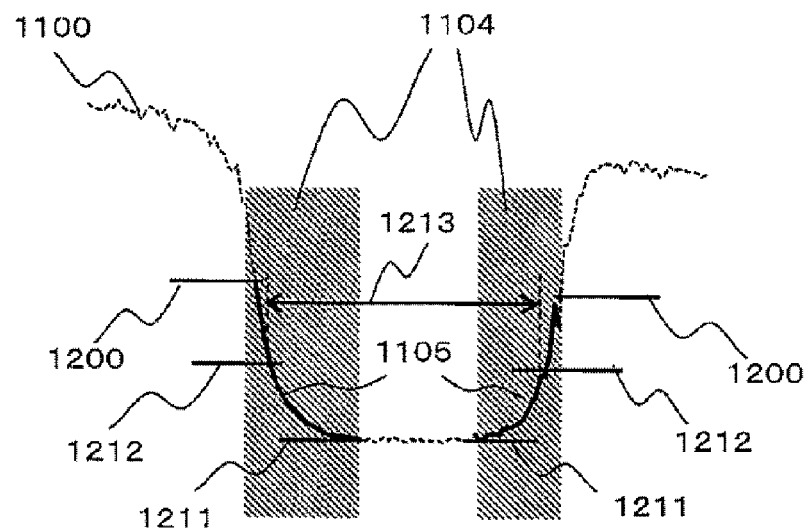

[FIG. 13A]
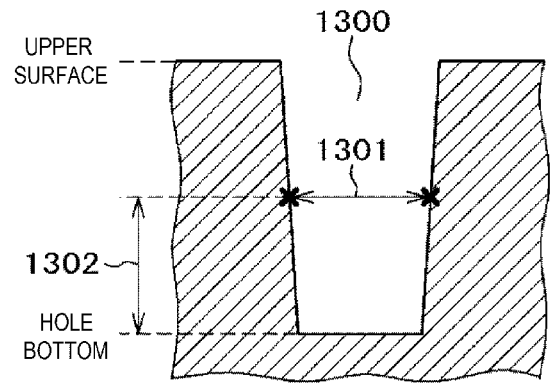
[FIG. 13B]
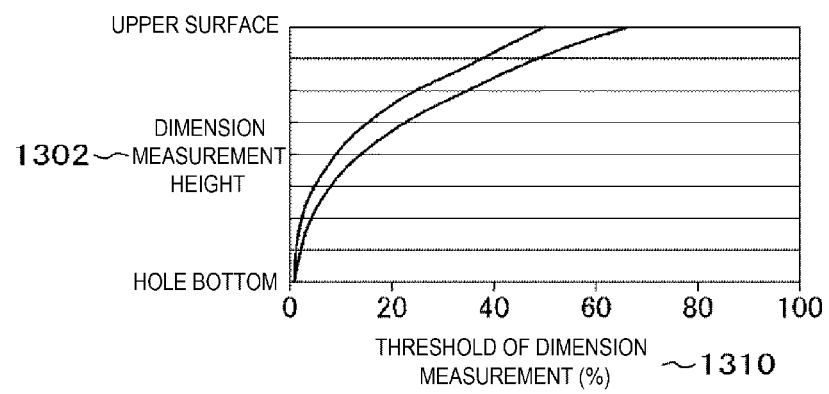
[FIG. 13C]
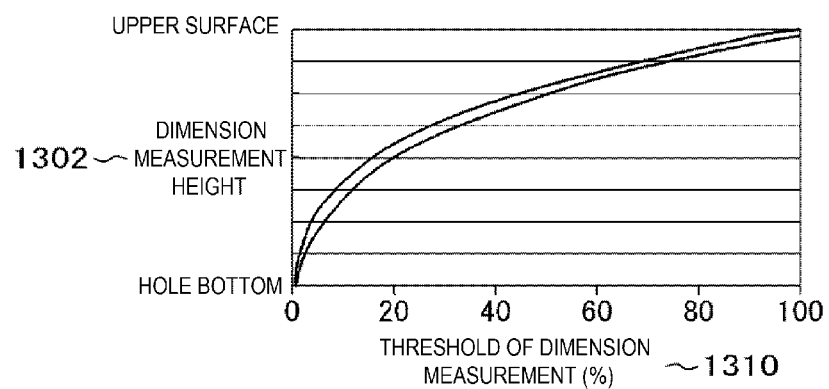

[FIG. 14]
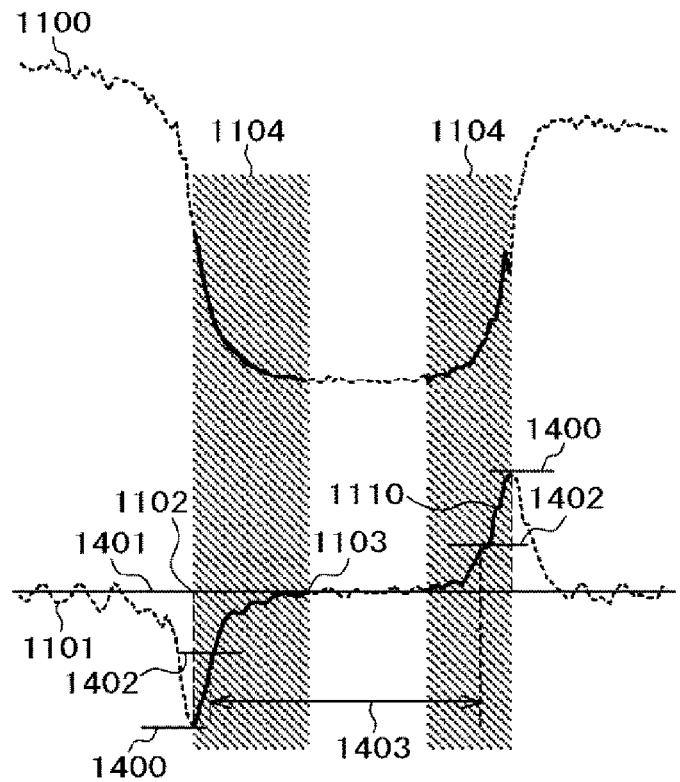
[FIG. 15]
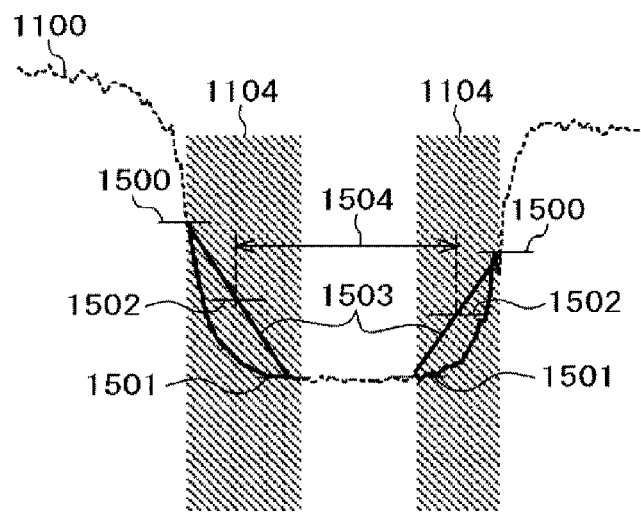

[FIG. 16]
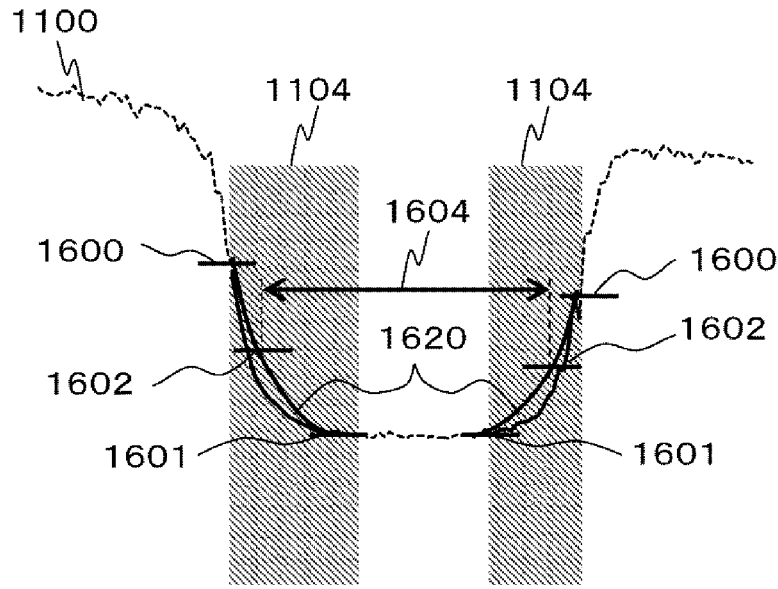
[FIG. 17]
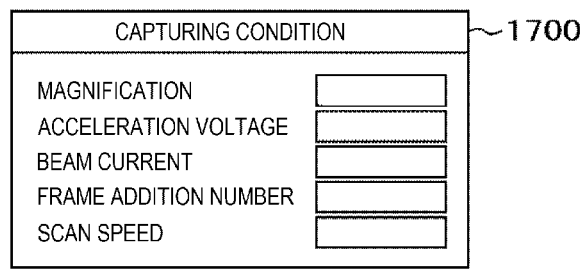
[FIG. 18]
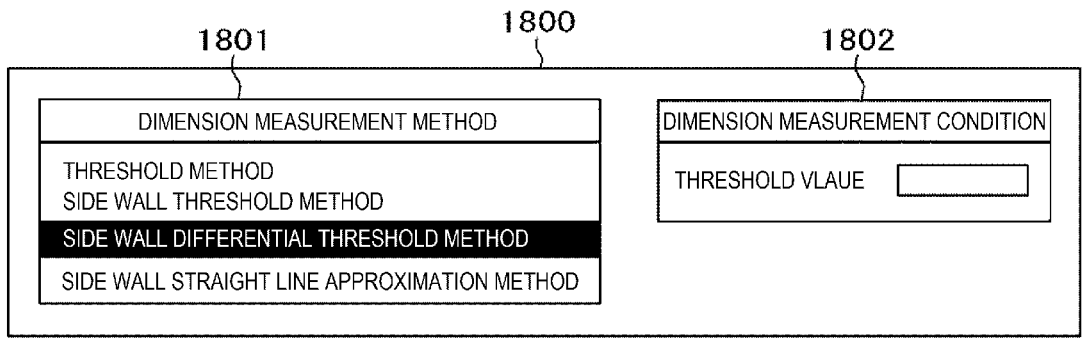

[FIG. 19]
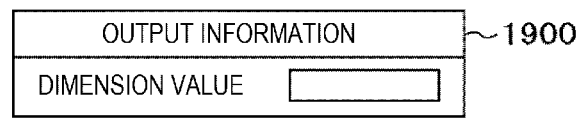

ELECTRON MICROSCOPE APPARATUS, INSPECTION SYSTEM USING ELECTRON MICROSCOPE APPARATUS, AND INSPECTION METHOD USING ELECTRON MICROSCOPE APPARATUS

TECHNICAL FIELD

The present invention relates to an electron microscope apparatus, an inspection system using an electron microscope apparatus, and an inspection method using an electron microscope apparatus.

BACKGROUND ART

It is widely practiced to measure a dimension of a pattern formed on a sample using an electron microscope apparatus. For example, Patent Literature 1 discloses a technique for measuring a dimension of a pattern of a hole formed in a sample using an electron microscope apparatus. Specifically, in order to measure a top diameter and a bottom diameter of a hole having an ultra-high aspect ratio, back scattered electrons (BSE) generated at a hole bottom are detected. At this time, the sample is irradiated with a primary electron beam accelerated by a high acceleration voltage, and the back scattered electrons (BSE) reflected by the sample are detected. Accordingly, the hole bottom is observed using "penetration BSE" that are emitted from the hole bottom and penetrate the side wall.

As described above, in Patent Literature 1, the dimension of the pattern of the hole formed in the sample is measured using a BSE signal (hereinafter referred to as a high acceleration BSE signal) obtained by irradiating the sample with the primary electron beam accelerated by the high acceleration voltage.

CITATION LIST

Patent Literature

Patent Literature 1: JP-A-2015-106530

SUMMARY OF INVENTION

Technical Problem

The above-mentioned "penetration BSE" penetrates the inside of a target around an irradiation position of the electron beam. Therefore, the high acceleration BSE signal changes according to a target shape in a penetration range.

In Patent Literature 1, a maximum value (max) and a minimum value (min value) of a signal waveform are used when measuring the dimension of the pattern of the hole. However, the maximum value (max) and the minimum value (min value) of the signal waveform differ depending on the target shape within the penetration range. As a result, in the dimension measurement method of Patent Literature 1, a measurement error that depends on a target shape around an irradiation position of the electron beam is generated.

An object of the invention is to prevent a measurement error that depends on a target shape around an irradiation position of an electron beam.

Solution to Problem

An electron microscope apparatus according to an aspect of the invention includes a detection unit that detects reflected electrons reflected from a sample when the sample is irradiated with primary electrons emitted by a primary electron generation unit, an image generation unit that generates an image of a surface of the sample with the reflected electrons based on output from the detection unit, and a processing unit that generates a differential waveform signal of the image generated by the image generation unit, processes the image by using information of the differential waveform signal, and measures a dimension of a pattern formed on the sample.

An inspection system using an electron microscope apparatus according to an aspect of the invention includes a detection unit that detects reflected electrons reflected from a sample when the sample is irradiated with primary electrons emitted by a primary electron generation unit, an image generation unit that generates an image of a surface of the sample with the reflected electrons based on output from the detection unit, a processing unit that generates a differential waveform signal of the image generated by the image generation unit, processes the image using information of the differential waveform signal, and measures a dimension of a pattern formed on the sample, and an input and output unit that inputs a condition to be processed by the processing unit and outputs a processed result. The processing unit determines quality of the dimension of the pattern formed on the sample by comparing the dimension of the pattern measured using the information of the differential waveform signal with a threshold stored in advance, and the input and output unit outputs a result of the quality of the dimension of the pattern formed on the sample determined by the processing unit.

An inspection method using an electron microscope apparatus according to an aspect of the invention includes irradiating a sample with primary electrons, detecting reflected electrons reflected from the sample, generating an image of a surface of the sample with the reflected electrons, generating a differential waveform signal of the image, processing the image using information of the differential waveform signal, and measuring a dimension of a pattern formed on the sample, determining quality of the dimension of the pattern formed on the sample by comparing the dimension of the pattern measured using the information of the differential waveform signal with a threshold stored in advance, and outputting a result of the determined quality of the dimension of the pattern.

Advantageous Effect

According to the invention, a measurement error that depends on a target shape around an irradiation position of an electron beam can be prevented.

BRIEF DESCRIPTION OF DRAWINGS

FIG. 1A is a block diagram showing a schematic configuration of a scanning electron microscope system according to a first embodiment.

FIG. 1B is a cross-sectional view of a pattern formed on a sample to be measured in the first embodiment.

FIG. 2 is a top view of a model used for simulation according to the first embodiment, a cross-sectional view of a dashed-dotted line portion A-A' in the top view, and a BSE signal waveform calculated by the simulation in the dashed-dotted line portion A-A'.

FIG. 3 is a diagram illustrating a principle in the first embodiment, which is a cross-sectional view of a hole pattern and cross-sectional view of a part of a sample showing a trajectory of electrons when a side wall is irradiated with an electron beam.

FIG. 4A is a diagram illustrating the principle in the first embodiment, which is a partial cross-sectional view of a part of the sample showing a scattering trajectory of BSE when the side wall is irradiated with the electron beam.

FIG. 4B is a diagram illustrating the principle in the first embodiment, which shows a probability distribution of a transmission distance in a solid until emitted electrons escape from a surface and a relationship between energy of the electrons and the transmission distance in the solid.

FIG. 5 is a diagram illustrating the principle in the first embodiment, which is a cross-sectional view of a part of a side wall of a measurement target and a graph showing a relationship between a depth of an irradiation position of the electron beam on the side wall and the probability distribution of the transmission distance.

FIG. 6A is a diagram illustrating the principle in the first embodiment, which is a cross-sectional view of the hole pattern and a cross-sectional view of a part of the sample showing a trajectory of electrons when an upper surface is irradiated with an electron beam.

FIG. 6B is a diagram illustrating the principle in the first embodiment, which is a cross-sectional view of a part of the sample showing a relationship between a distance from an irradiation position of the electron beam to a top edge and the electron scattering on the upper surface of the measurement target and shows a state in which the distance from the irradiation position of the electron beam to the top edge is long.

FIG. 6C is a diagram illustrating the principle in the first embodiment, which is a cross-sectional view of a part of the sample showing a relationship between the distance from the irradiation position of the electron beam to the top edge and the electron scattering on the upper surface of the measurement target and shows a state in which the distance from the irradiation position of the electron beam to the top edge is shorter than that in the state of FIG. 6B.

FIG. 6D is a diagram illustrating the principle in the first embodiment, which is a partial cross-sectional view of the sample showing a relationship between the distance from the irradiation position of the electron beam to the top edge and the electron scattering on the upper surface of the measurement target to be measured and shows a state in which the irradiation position of the electron beam is almost on the top edge.

FIG. 7A is a diagram illustrating the principle in the first embodiment, and shows contour lines of a cross-sectional shape corresponding to right half of the dashed-dotted line portion A-A' in the plan view of the sample in an upper part of FIG. 2 in models having different widths of the hole in the cross-sectional view of the pattern in a middle part of FIG. 2 of a reference width, a reference width +10%, and a reference width −10%, a BSE signal waveform calculated by simulation and a differential signal waveform.

FIG. 7B is a diagram illustrating the principle in the first embodiment, and shows contour lines of the cross-sectional shape corresponding to the right half of the dashed-dotted line portion A-A' in the plan view of the sample in the upper part of FIG. 2 in models having different side wall angles of the pattern in the cross-sectional view of the pattern in the middle part of FIG. 2 of 89.6, 89.8, and 89.9°, a BSE signal waveform calculated by simulation and a differential signal waveform.

FIG. 8A is a diagram illustrating the principle in the first embodiment, which is a cross-sectional view of a wide pattern showing a relationship between a target shape (line width, side wall angle) and electron scattering on the upper surface of the target to be measured.

FIG. 8B is a diagram illustrating the principle in the first embodiment, which is a cross-sectional view of a pattern having a smaller width than that in FIG. 8A showing a relationship between a target shape (line width, side wall angle) and electron scattering on the upper surface of the target to be measured.

FIG. 8C is a diagram illustrating the principle in the first embodiment, which is a cross-sectional view of a pattern in which the width of an upper end is smaller than that in FIG. 8A showing a relationship between a target shape (line width, side wall angle) and electron scattering on the upper surface of the target to be measured.

FIG. 9A is a flowchart illustrating dimension measurement processing using the scanning electron microscope system according to the first embodiment.

FIG. 9B is a flowchart illustrating the dimension measurement processing using the scanning electron microscope system according to the first embodiment, which is a flowchart of processing of performing dimension determination of a hole bottom following the processing of FIG. 9A.

FIG. 10 shows a BSE image of a hole pattern in the first embodiment, a dimension measurement region in the image, a BSE signal waveform in the dimension measurement region, and a signal waveform by adding and averaging the BSE signal waveform.

FIG. 11 is a diagram showing a BSE signal waveform and a differential signal waveform thereof in the first embodiment.

FIG. 12 is a diagram showing a BSE signal waveform showing an outline of a dimension measurement method according to the first embodiment.

FIG. 13A is a cross-sectional view of a hole pattern illustrating the principle in the first embodiment.

FIG. 13B is a diagram illustrating the principle in the first embodiment, which is a graph showing a relationship between a threshold specified by the user and a range in which a dimension measurement height corresponding to the threshold varies when, for the signal waveforms shown in FIGS. 7A and 7B, a position corresponding to a signal that internally divides a maximum value and a minimum value of the signal with the threshold is detected and a distance between left and right positions is calculated as a dimension value.

FIG. 13C is a diagram illustrating the principle in the first embodiment, which is a graph showing a relationship between a threshold when the first embodiment is applied to the signal waveforms shown in FIGS. 7A and 7B and a range in which the dimension measurement height corresponding to the threshold varies.

FIG. 14 is a signal waveform diagram showing a BSE signal waveform and a differential signal waveform thereof showing an outline of a dimension measurement method according to a second embodiment.

FIG. 15 is a waveform diagram of a BSE signal showing an outline of a dimension measurement method according to a third embodiment.

FIG. 16 is a waveform diagram of a BSE signal showing an outline of a dimension measurement method according to a fourth embodiment.

FIG. 17 is a front view of a screen for setting a capturing condition according to a fifth embodiment.

FIG. 18 is a front view of a screen for setting a dimension measurement method and inputting a dimension measurement condition according to the fifth embodiment.

FIG. 19 is a front view of an output screen of a dimension measurement result according to the fifth embodiment.

DESCRIPTION OF EMBODIMENTS

Embodiments of the invention will be described below with reference to the drawings.

As shown in FIG. 1A, an electron microscope apparatus according to the embodiments of the invention includes a detection unit (annular scintillator 106) that detects reflected electrons 110 reflected from a sample 120 when the sample 120 is irradiated with primary electrons 102 emitted by a primary electron generation unit (electron gun 101), an image generation unit 113 that generates an image of a surface of the sample 120 by the reflected electrons 110 based on output from the detection unit (annular scintillator 106), and a processing unit 022 that generates a differential waveform signal of the image generated by the image generation unit 113, processes the image by using information of the differential waveform signal, and measures a dimension of a pattern formed on the sample 120. As described above, in the embodiments of the invention, in order to prevent a measurement error that depends on a target shape around an irradiation position of the electron beam, the image is processed using the information of the differential waveform signal of the image generated by the image generation unit 113.

Specifically, when the sample 120 is irradiated with a high-energy electron beam (primary electrons 102), considering characteristics of the BSE signal 110 generated from the sample 120, a position at which a differential signal waveform obtained by differentiating the BSE signal 110 is maximum is captured as an upper end of a side wall of the pattern formed on the sample. Further, a position at which an absolute value of the differential signal waveform obtained by differentiating the BSE signal 110 is minimum is captured as a lower end of the side wall of the pattern formed on the sample, and the BSE signal waveform between the lower end and the upper end of the side wall of the pattern is extracted. For signals in the extracted range, a position corresponding to a signal that internally divides the maximum value and the minimum value with a threshold specified by a user is detected, and a distance between left and right positions is calculated. As a result, the dimension of the positions (depth) corresponding to the threshold can be measured regardless of the shape of the pattern.

Hereinafter, the embodiments of the invention will be described with reference to the drawings.

First Embodiment (Apparatus Configuration)

FIG. 1A is an example of a basic configuration of a scanning electron microscope system to which the invention is applied. A scanning electron microscope system 100 includes a capturing optical system 001, a control unit 021, the processing unit 022, a storage unit 023, and an input and output unit 024.

The capturing optical system 001 includes an electron optical system including the electron gun 101, a condenser lens 103, a deflector 104, an objective lens 105, the annular scintillator 106, an optical fiber 111, and a photo multiplier (PM) tube 112, a stage 108, and the image generation unit 113.

The electron gun 101 generates the primary electron beam 102 having a high acceleration voltage (a voltage greater than 15 kV). The condenser lens 103 and the objective lens 105 focus the primary electron beam 102 on a surface of the sample 120. The deflector 104 two-dimensionally scans the sample 120 with the primary electron beam 102. The annular scintillator 106 receives the BSE 110 having high energy (energy greater than 50 eV) among electrons emitted from the sample 120 and converts the BSE signal into an optical signal. The optical fiber 111 guides the optical signal to the photomultiplier tube 112.

The photomultiplier tube 112 converts and multiplies the optical signal into an electric signal. The image generation unit 113 generates a digital image using the multiplied signal (BSE signal). By moving the sample 120, the stage 108 enables image capturing of the sample 120 at an arbitrary position.

The control unit 021 controls a voltage applied to the periphery of the electron gun 101, focus position adjustment of the condenser lens 103 and the objective lens 105, a movement of the stage 108, an operation timing of the image generation unit 113, and the like. The processing unit 022 processes the captured image generated by the image generation unit 113 (image processing) and performs dimension measurement processing.

The storage unit 023 stores the captured image generated by the image generation unit 113, a capturing condition input by the user from the input and output unit 024, a dimension measurement condition, and the like.

The input and output unit 024 has a display screen 0241 and performs input of the capturing condition, input of the dimension measurement condition, output of displaying a dimension measurement result on the display screen 0241, and the like.

By using the configuration shown in FIG. 1A, when a hole bottom 1202 of a hole pattern 1201 formed in the sample 120 having a cross section as shown in FIG. 1B is irradiated with the primary electron beam, it is possible to detect "penetration BSE" that are emitted from the hole bottom 1202 and penetrate the side wall 1203. Accordingly, an image having information on a structure of the hole pattern 1201 can be obtained.

For example, when the hole pattern 1201 having a depth of 1.5 μm and an aspect ratio of 10 formed on the sample 120 made of Si is targeted, the hole bottom 1202 is irradiated with the primary electron beam 102 at an acceleration voltage of 15 kV. Accordingly, the BSE are emitted from the hole bottom 1202, and a part of the emitted BSE penetrates the side wall 1203 of the hole pattern 1201 and reaches the annular scintillator 106. Although electrons that reach the scintillator 106 include secondary electrons generated on an upper surface of the sample 120, it is possible to obtain an image including a large number of BSE components penetrating the side wall 1203 of the hole pattern 1201 by detecting only electrons having energy of 50 eV or more.

(Characteristics of Captured Image)

An example of a BSE signal waveform obtained by the scanning electron microscope system 100 used in the present embodiment is shown using a result of an electron beam simulation (Monte Carlo simulation). An acceleration voltage during the simulation is set to 30 kV, and the BSE signal waveform is obtained by detecting electrons with energy of 50 eV or more among the electrons emitted from the measurement target with a detector (the scintillator 106 in the case of the configuration in FIG. 1).

210 in an upper part in FIG. 2 is a plan view of a model used in the simulation. On a left side of the model is a flat portion (hereafter referred to as an upper surface) 2101 having no pattern, and on a right side, square hole patterns 2102 are formed in a grid pattern at intervals the same as width of the holes.

250 in a middle part of FIG. 2 is a cross-sectional view of a sample 220 (corresponding to 120 in FIG. 1A) taken along a dashed-dotted line portion A-A' of the plan view 210. A hole pattern 221 is assumed to be a contact hole of a 3D-NAND device, a depth 200 of the hole pattern 221 is several micrometers, an aspect ratio of the hole pattern 221 is 40, and a side wall angle 202 is 89.8°.

230 in FIG. 2 denotes a BSE signal waveform calculated by the simulation in the dashed-dotted line portion A-A' in the plan view 210. BSE signals 2031 and 2032 at portions corresponding to the side wall 203 decrease as an irradiation position of the electron beam deeper, and BSE signals 2041 and 2051 at portions corresponding to upper surfaces 204 and 205 decrease as the irradiation position of the electron beam approaches the side wall 203. BSE signal 2061 at a portion corresponding to a bottom surface 206 is constant regardless of the irradiation position of the electron beam.

A relationship between the BSE signal waveform on the side wall 203 and a target cross-sectional shape will be described in detail with reference to FIGS. 3 to 5.

FIG. 3 is a cross-sectional view of the hole pattern 221 formed in the sample 220, which is a schematic view of a trajectory of electrons when the side wall 203 of the hole pattern 221 is irradiated with the primary electron beam 102. Here, FIG. 3 shows the same cross section as the cross-sectional view 250 in FIG. 2. However, FIG. 3 is a diagram in which inclination of the side wall 203 of the hole pattern 221 in the cross-sectional view 250 shown in FIG. 2 is emphasized, and FIG. 3 differs from the cross-sectional view 250 shown in FIG. 2 in vertical and horizontal dimensional ratios.

When the side wall 203 of the hole pattern 221 of the measurement target is irradiated with the primary electron beam 102, three types of electrons are generated, including electrons 300 emitted upward from the upper surface 204 after repeating scattering in the sample 220 (hereinafter referred to as upward jumping electrons), electrons 301 jumping downward from the side wall 203 in the process of the scattering (hereinafter referred to as downward jumping electrons), and electrons 302 that directly penetrate the inside of the sample 220.

Among these, the upward jumping electrons 300 are detected by an upper detector (for example, the scintillator 106 in FIG. 1A) provided above the sample 220, while the downward jumping electrons 301 travels straight in a vacuum and then enters the measurement target again at a deep portion of the hole pattern 221.

Accordingly, since a transmission distance for electrons to transmit the inside of the sample 220, which is necessary to escape upward from the upper surface 204, is long, most of the downward jumping electrons 301 cannot escape from the sample 220, and detection signals detected by the scintillator 106, which is the detector provided above the sample 220, are reduced. However, since a scattering range from an irradiation position is considered to be constant regardless of the depth of the irradiation position if the side wall angle is constant in the side wall 203, proportions of the upward jumping electrons 300 and the downward jumping electrons 301 are constant.

Therefore, a reduction amount of the signal due to the downward jumping electrons 301 is regarded as constant in the side wall, and a relationship between a BSE signal amount based on the upward jumping electrons 300 and a depth will be described below.

FIG. 4A is a schematic view of a scattering trajectory of the upward jumping electrons 300 jumping upward from the upper surface 204 when the side wall 203 of the hole pattern 221 formed in the sample 220 to be measured is irradiated with the primary electron beam 102.

Since the electrons repeat random scattering inside the sample 220 to be measured, the trajectory traced until each electron escapes from the upper surface 204 is stochastically determined. In trajectories 401, 402, and 403 of the primary electron beam 102 entering the inside of the sample 220 from the side wall 203 shown in FIG. 4A, a transmission distance in a solid (inside the sample 320) along each trajectory becomes longer in an order of 401<402<403.

FIG. 4B is an example of a probability distribution of the transmission distance in the solid (inside of the sample 220) of each electron with which the side wall 203 of the sample 220 to be measured is irradiated. Since the electron scattering inside the sample 220 follows a Poisson process, a probability distribution 410 is considered to be a Poisson distribution.

A graph 406 shows a relationship between energy of the electrons and a transmission distance in the solid (inside the sample 220). The electrons gradually lose energy at the time of irradiation in accordance with the transmission distance in the solid, and are absorbed by the sample 220 to be measured when certain energy is lost. The relationship between the transmission distance and the energy is generally known as the Bethe Formula.

That is, a maximum distance 405 that allows the electrons to transmit the solid (hereinafter referred to as a limit transmission distance) is determined by the energy of the primary electron beam 102 when irradiated. For example, when electrons having the energy of 30 keV as the primary electron beam 102 enters a Si substrate which is the sample 220, the limit transmission distance 405 of the electrons is about 6 micrometers.

Therefore, in a graph shown on an upper side of FIG. 4B (the probability distribution 410 of the transmission distance of the electrons), the electrons that can escape from the upper surface 204 before being absorbed by the sample 220 to be measured are transmitted through the inside of the sample 220 to be measured. A graph on a lower side of FIG. 4B shows electrons whose transmission distance does not exceed the limit transmission distance 405. A cumulative probability 404 within the range corresponds to the BSE signal detected by the scintillator 106, which is a detector provided above the sample 220.

A cross-sectional view on an upper side of FIG. 5 shows a relationship between irradiation positions (3031, 3032, 3033) of the primary electron beam 102 on the side wall 203 of the sample 220 and upward jumping electrons 3001, 3002, and 3003. A graph on a lower side shows a relationship between a depth of the irradiation positions (3031, 3032, 3033) of the primary electron beam 102 on the side wall 203 and a probability distribution of the transmission distance.

When the irradiation positions 3031, 3032, 3033 of the primary electron beam 102 on the side wall 203 become deeper in order, the transmission distance in the solid necessary for the upward jumping electrons 3001, 3002, and 3003 to escape from the upper surface 204 of the sample 220 (length of a path for passing through the inside of the sample 220) becomes longer in order, and electron probability distributions 511, 512, and 513 in the graph shown on the lower side of FIG. 5 shift in a direction in which the transmission distance in the solid increases.

Accordingly, since undetected electrons whose transmission distance exceeds the limit transmission distance 405 increase, the BSE signal decreases. When the energy of the emitted electrons is large, for example, 15 keV or more, average values 501, 502, and 503 at each irradiation position of the transmission distance in the solid (the inside of the sample 220 that is the Si substrate) when the irradiation positions 3031, 3032, and 3033 are irradiated with the primary electron beam 102 are all larger than the limit transmission distance 405.

Therefore, a detection range of the BSE signal (region of the cumulative probability 404 hatched in the graph on the lower side in FIG. 5) is always a region below the average value of the distribution (or a peak value or less), that is, a range that monotonically increases corresponding to the transmission distance.

Since the BSE signal obtained by detecting the upward jumping electrons 3001, 3002, and 3003 by the detector (the scintillator 106) corresponds to an integrated value in this range, when the probability distributions 511, 512, and 513 shift in the direction of longer transmission distance (in the example shown in FIG. 5, the probability distribution is in the direction of from 511 or 512 to 513), the BSE signal decreases, and a change rate of the BSE signal corresponding to the irradiation positions 3031, 3032, and 3033 also decreases.

That is, as shown in the BSE signal waveform 230 in FIG. 2, when the side wall 203 is irradiated with the electron beam, the obtained BSE signal decreases and the change rate of the signal decreases corresponding to the depth of the irradiation position.

Next, a relationship between the BSE signal waveform and a target cross-sectional shape at the upper surfaces 204 and 205 will be described in detail with reference to FIGS. 6A to 6D.

FIG. 6A is a schematic cross-sectional view of the hole pattern and schematic diagram of the trajectory of electrons when the upper surface is irradiated with the primary electron beam 102. Even when the surface (upper surface 204) of the measurement target (sample 220) is irradiated with the electron beam, similar to the case of the side wall 203, three types of electrons are generated, including the upward jumping electrons 300, the downward jumping electrons 301, and the electrons 302 that do not jump out and go straight down. In the upper surface 204, it is considered that proportions of the upward jumping electrons 300 and the downward jumping electrons 301 change depending on a distance from the irradiation position 2041 to a top edge 207. A relationship between a BSE signal amount based on the proportions of the upward jumping electrons 300 and the downward jumping electrons 301 and a distance from the irradiation position of the primary electron beam 102 to the top edge 207 will be described below.

FIGS. 6B to 6D are diagrams showing a relationship between a distance from irradiation positions 2042 to 2044 of the primary electron beam 102 to the top edge 207 and the electron scattering on the upper surface 204 of the measurement target. The emitted electrons repeatedly scatter within the measurement target, and a diffusion range is widened according to the transmission distance. A part of the electrons irradiated in the process jump out into the vacuum from the side wall 203.

In general, since the emitted electrons are diffused in a fan-like shape in an irradiation direction, when the irradiation positions 2042 to 2044 approach the side wall 203, a ratio of the downward jumping electrons 301 is increased and an increase rate thereof also increases. As described above, since most of the downward jumping electrons 301 cannot escape and are not detected, the detection signal decreases only by the increment of the downward jumping electrons 301.

That is, as shown in the BSE signal waveform 230 on the lower side of FIG. 2, when the upper surfaces 204 and 205 are irradiated with the electron beam, as the irradiation position is closer to the top edge 207, the obtained BSE signal decreases, and the change rate of the signal increases.

Finally, a relationship between the BSE signal waveform and the target cross-sectional shape on the bottom surface 206 will be described.

When the bottom surface of the measurement target is irradiated with the electron beam, only the upward jumping electrons 300 are generated. As described above, the influence of the upward jumping electrons 300 on the signal changes according to the depth of the irradiation position of the electron beam. Accordingly, when the bottom surface is flat, the depth of the irradiation position is constant, and thus the BSE signal is also constant.

That is, as shown in the BSE signal waveform 230 on the lower side in FIG. 2, the BSE signal waveform obtained by irradiating the bottom surface 206 with the primary electron beam 102 is constant regardless of the irradiation position.

As described above, to summarize characteristics of the BSE signal, on the upper surfaces 204 and 205, the signal amount decreases and the change rate of the signal increases as the irradiation position becomes closer to the top edge 207. On the side wall 203, the signal amount decreases and the change rate of the signal decreases as the irradiation position becomes deeper. On the bottom surface 206, the signal amount is substantially constant and the change rate of the signal is zero regardless of the irradiation position of the primary electron beam 102.

Based on the above characteristics, it is considered that the change rate of the signal, that is, an absolute value of a differential signal becomes maximum at the position of the top edge 207. It is also considered that the signal becomes minimum at the position of a bottom edge 208.

FIGS. 7A and 7B show a relationship between the top edge, the bottom edge position, and the BSE signal. An upper part of FIG. 7A shows contour lines 2031, 2032, and 2033 of the cross-sectional shape of the hole pattern 221 corresponding to the right half of the dashed-dotted line portion A-A' in the plan view 210 of FIG. 2 in the model in which the width 201 of the hole in the cross-sectional view 250 of the sample 220 shown in FIG. 2 is different.

A middle part of FIG. 7A shows BSE signal waveforms 20311, 20321, 20331) for cross-sectional shapes corresponding to the contour lines 2031, 2032, and 2033 calculated in the simulation. A lower part of FIG. 7A shows differential signal waveforms (20312, 20322, 20332) corresponding to the BSE signal waveforms 20311, 20321, and 20331 in the middle part.

The contour line 2031 corresponds to the BSE signal waveform 20311 and the differential signal waveform 20312. The contour line 2032 corresponds to the BSE signal waveform 20321 and the differential signal waveform 20322. Further, the contour line 2033 corresponds to the BSE signal waveform 20331 and the differential signal waveform 20332.

The width 201 of the hole pattern 221 is a reference width (contour line 2031), a reference width +10% (contour line 2032), and a reference width −10% (contour line 2033).

An upper part of FIG. 7B shows contour lines 2034, 2035, 2036, and 2036 of the cross-sectional shape corresponding to the right half of the dashed-dotted line portion A-A' in the plan view 210 of FIG. 2 in the model in which the side wall angle 202 in the cross-sectional view 250 shown in FIG. 2 is different. A middle part shows BSE signal waveforms 20341, 20351, 20361 calculated by the simulation. A lower part shows differential signal waveforms 20342, 20352, 20362.

The contour line 2034 corresponds to the BSE signal waveform 20341 and the differential signal waveform 20342. The contour line 2035 corresponds to the BSE signal waveform 20351 and the differential signal waveform 20352. The contour line 2036 corresponds to the BSE signal waveform. 20361 and the differential signal waveform 20362.

The side wall angle 202 is 89.6° for the contour line 2034, 89.8° for the contour line 2035, and 89.9° for the contour line 2036.

The signal amount (BSE signal waveforms 20311, 20321, 20331 and 20341, 20351, 20361) detected above the upper surface 205 changes depending on, in FIG. 7A, the width 201 of the hole, that is, a thickness of the wall between adjacent holes, and, in FIG. 7B, the side wall angle 202.

As shown in FIGS. 8A to 8C, with changes in line widths W1, W2, and W3 and side wall angles θ1, θ2, and θ3, it is considered that the number of downward jumping electrons 3011 to 3015 changes depending on the distance from irradiation positions 2045, 2046, and 2047 to top edges 2077, 2078, and 2079.

Even for models with different shapes and different BSE signals, as shown in FIGS. 7A and 7B, absolute values of the differential signals 20312, 20322, 20332, and 20342, 20352, 20362 are maximum at positions of top edges 2071 to 2076 of the cross-sectional shapes, and signals are minimum at positions of bottom edges 2081 to 2084.

Therefore, a range between a position where the absolute value of the differential signal corresponding to the position of the top edge of the cross-sectional shape (207 in FIG. 6A) is maximum and a position where the signal corresponding to the position of the bottom edge (208 in FIG. 6A) is minimum is regarded as the side wall, and the signal waveform within the range is used for the dimension measurement. Accordingly, it is possible to measure a dimension corresponding to the depth between the top edge and the bottom edge.

(Procedure)

Dimension measurement processing based on the above-mentioned characteristics of the BSE signal waveform will be described below.

FIG. 9A is an example of a flowchart illustrating the dimension measurement processing using the scanning electron microscope system 100 shown in FIG. 1.

First, the input and output unit 024 receives input of capturing conditions such as a capturing magnification and an acceleration voltage from a user (S100).

Subsequently, the capturing optical system 001 captures a BSE image of the measurement target based on the input capturing conditions (S101).

Next, the input and output unit 024 receives input of dimension measurement conditions such as a dimension measurement region for the BSE image (S102). For example, in an example of a BSE image 1050 of a hole pattern 1020 shown in FIG. 10, when measuring a width of the hole pattern 1020, the input and output unit 024 receives input of a dimension measurement region 1000 by the user selecting a region including the measurement target using a rectangular cursor 1010 on a GUI. In addition, input of measurement parameters such as a dimension measurement direction and a threshold used for the dimension measurement is also received in accordance with position information of the cursor 1010.

These dimension measurement conditions are previously set by the user and registered in the storage unit 023 so that the processing unit 022 can use the registered dimension measurement conditions at the time of measurement. Accordingly, it is possible to measure the dimension of a pattern manufactured in the same process under the same dimension measurement conditions.

Next, the processing unit 022 acquires BSE signal waveforms 1001-1 to 1001-*n* in the dimension measurement region 1000 in the BSE image 1050 based on the input dimension measurement conditions (S103). For example, as shown in FIG. 10, in the dimension measurement region 1000, a BSE signal waveform 1002 in which the influence of noise is reduced can be obtained by adding and averaging the BSE signal waveforms 1001-1 to 1001-*n* in the dimension measurement direction.

Processing from S104 to S106 will be described with reference to FIG. 11. FIG. 11 shows an example of a BSE signal waveform 1100 and a differential signal waveform 1101 thereof.

The processing unit 022 calculates the differential signal waveform 1101 of the acquired BSE signal waveform 1100 (S104).

Next, the processing unit 022 acquires a position 1102 at which an absolute value of the differential signal waveform 1101 is maximum and a position 1103 at which the absolute value is zero (S105). Accordingly, the top edge position and the bottom edge position of the measurement target can be grasped. The same effect can be obtained by using a position where the absolute value of the differential signal waveform 1101 is minimum instead of the position 1102 where the differential signal waveform 1101 is zero.

Next, the processing unit 022 extracts a BSE signal waveform 1105 (range of a waveform indicated by a thick line in FIG. 11) of a hatched range 1104 in FIG. 11 between the position 1102 at which the absolute value of the differential signal waveform 1101 is maximum and the position 1103 at which the absolute value is zero (S106). As described above, the extracted BSE signal waveform corresponds to the side wall of the measurement target.

Next, the processing unit 022 performs dimension measurement on the BSE signal waveform 1105 extracted in S106, using the dimension measurement conditions such as an input threshold (S107). FIG. 12 is a diagram illustrating an outline of a dimension measurement method of the present embodiment. In the present embodiment, a position corresponding to a signal 1212 that internally divides between a maximum value 1200 and a minimum value 1211 of the BSE signal waveform 1105 in the range 1104 extracted in S106 is detected with the threshold specified by the user, and a distance 1213 between left and right positions is calculated.

Since the BSE signal waveform 1100 in the extracted range 1104 described above corresponds to the BSE signal of the side wall and changes depending on the depth, the dimension 1213 (distance between the left and right positions) at the depth corresponding to the specified threshold can be measured. Accordingly, a measurement error depending on a target shape can be reduced, and highly accurate dimension measurement can be performed.

Finally, the input and output unit 024 displays a dimension measurement result calculated by the calculation unit 022 on the display screen 0241 of the input and output unit 024 and outputs the measurement result to an external information processing device or storage device through a line (not shown) (S108).

On the other hand, the positions of the left and right top edges 207 on the BSE signal waveform can be calculated based on information on the position 1102 at which the absolute value of the differential signal waveform 1101 obtained in S106 is maximum. On outer sides of the obtained left and right top edges 207 (regions corresponding to the upper surfaces 204 and 205 of the sample), the upper surfaces 204 and 205 of the sample are originally formed at the same height as shown in the cross-sectional view 250 in FIG. 2.

However, a level of the BSE signal (luminance level when the image is formed) is not necessarily at the same level under the influence of a pattern formed in the periphery. When an image is formed by using the BSE signal directly, an image in which brightness unevenness occurs on a surface part around the hole pattern 221 is obtained.

Therefore, in the present embodiment, by using the position information on the top edge 207, the luminance level of the image outside the top edge (regions corresponding to the upper surfaces 204 and 205 of the sample) is averaged or corrected according to the luminance of the position of the top edge 207 so that the BSE image in which the color unevenness on the sample surface is corrected (the color unevenness is reduced or eliminated) can be generated.

A flowchart shown in FIG. 9A is performed up to the steps of the dimension measurement (S107) and outputting the result (S108), and quality may be determined based on the measurement result.

FIG. 9B shows a flow of quality determination performed after the dimension measurement (S107) of FIG. 9A. That is, in the flowchart illustrated in FIG. 9B, following the flow to the dimension measurement (S107) described in FIG. 9A, a dimension of the hole bottom among the dimensions measured in S107 is compared with a threshold stored in advance (S109).

As a result of comparison, the hole bottom dimension determination is executed (S110). If a measured hole bottom dimension is greater than the threshold, the hole is formed correctly and is accepted, and if the measured hole bottom dimension is smaller than the threshold, the hole is not formed correctly and is rejected. The determination result is displayed on the display screen 0241 of the input and output unit 024, and is output to an external information processing device or storage device through a line (not shown) (S111).

The effect of the first embodiment is shown with reference to FIGS. 13A to 13C. FIG. 13A is an example of a cross-sectional view of a hole pattern 1300. As shown in FIG. 13A, a height from the bottom of the side wall corresponding to a dimension measurement value 1301 when the hole pattern 1300 is dimensionally measured with a threshold 1310 is defined as a dimension measurement height 1302.

FIG. 13B shows a relationship between a range in which the threshold 1310 used for the dimension measurement and the corresponding dimension measurement height 1302 vary when the dimension measurement is performed using the BSE signal waveforms shown in FIGS. 7A and 7B. FIG. 13B is a result of detecting a position corresponding to the signal that internally divides the maximum value and the minimum value of the signal with the threshold specified by the user for the signal waveform in the range between the maximum and minimum positions of the BSE signal waveform and calculating a distance between the left and right positions, and corresponds to the measurement result by the dimension measurement method in the related art.

FIG. 13C shows a case where the position corresponding to the signal that internally divides the maximum value and the minimum value of the signal with the threshold specified by the user is detected for the BSE signal waveform in a range between a position where the absolute value of the differential signal waveform obtained based on the BSE signal waveform is maximum and the position where it is zero, and the distance between the left and right positions is calculated, and corresponds to the measurement result according to the present embodiment. Compared to FIG. 13B, the variation in the dimension measurement height 1302 with respect to the threshold 1310 is smaller in FIG. 13C. That is, by using the present embodiment, highly accurate dimension measurement is possible since it is possible to measure a dimension having a stable dimension measurement height regardless of the target shape.

Although the cursor 1010 for selecting the dimension measurement region 1000 shown in FIG. 10 is arbitrarily set by the user, when the maximum value of the signal is located at a cursor end portion as shown in the signal waveform 1002, the maximum value changes depending on the arrangement of the cursor 1010. Therefore, in the dimension measurement method in the related art using the maximum value of the signal, there is a problem that the dimension measurement value changes depending on the arrangement of the cursor 1010. On the other hand, if the cursor 1010 includes the measurement target 1020, the maximum value of the absolute value of the differential signal is always located in the dimension measurement region 1000 and does not change depending on the arrangement of the cursor 1010. That is, by using the present embodiment, stable dimension measurement can be performed regardless of the arrangement of the cursor 1010. The same effect is not limited to the measurement using the BSE signal waveform shown in the present embodiment, and can also be obtained in the case where an SE signal waveform or the like is used.

Although the example of the hole pattern is described in the first embodiment described above, the invention can also be applied to a groove pattern, and the same effect can be obtained.

Further, in the above-described embodiment, the acceleration voltage of the electron gun 101 is set to 15 kV or more, assuming that the target is a deep hole. For a shallow hole, the same effect can be obtained even if the acceleration voltage is less than 15 kV as long as the penetration electrons can be detected.

Second Embodiment

A second embodiment will describe an example of using a method of detecting a position corresponding to a signal that internally divides a maximum value and a minimum value of the signal with a threshold specified by a user with respect to a differential signal waveform instead of the BSE signal waveform in the dimension measurement described in the first embodiment, and calculating a distance between left and right positions.

A configuration of a scanning electron microscope system used in the second embodiment is the same as that of the scanning electron microscope system 100 shown in FIG. 1 described in the first embodiment.

Since the flow of the present embodiment is the same except for the dimension measurement (S107) in the flowchart in the first embodiment of FIG. 9, only the dimension measurement (S107) will be described with reference to FIG. 14.

A differential signal waveform 1110 extracted by using the BSE signal waveform 1105 extracted in the hatched range 1104 between the position 1102 where the absolute value of the differential signal waveform 1101 obtained based on the BSE signal waveform 1100 is maximum and the position 1103 where it is zero is generated (a range of waveform indicated by a thick line in FIG. 14).

Next, the dimension measurement is performed on the extracted differential signal waveform 1110 by using dimension measurement conditions such as an input threshold. A position corresponding to a differential signal 1402 that internally divides a maximum value 1400 of the absolute value of the differential signal waveform 1110 and a zero 1401 is detected with a threshold specified by the user, and a distance 1403 between left and right positions is calculated. The extracted differential signal waveform 1110 corresponds to a differential signal of the side wall 203.

For the BSE signal waveform 1105, the method of detecting the position corresponding to the signal that internally divides the maximum value and the minimum value of the signal with the threshold specified by the user, and calculating the distance between left and right positions cuts the threshold for the range of maximum and minimum signals. Accordingly, when measuring the dimension near the hole bottom, a margin of setting the threshold is small since the signal change amount is small with respect to the above range.

On the other hand, for the differential signal waveform 1110, the method of detecting the position corresponding to the signal that internally divides the maximum value and the minimum value of the signal with the threshold specified by the user and calculating the distance between left and right positions cuts the threshold for the maximum change rate of the signal, and thus the margin of the threshold is relatively large even for the waveform near the hole bottom. Therefore, the second embodiment is effective for the dimension measurement near the hole bottom.

Third Embodiment

In a third embodiment, an example of using a straight line connecting a position corresponding to the top edge 207 where the signal change rate is maximum and a position corresponding to the bottom edge 208 where the signal is minimum instead of the BSE signal waveform in the dimension measurement described in the first embodiment is described.

A configuration of a scanning electron microscope system used in the third embodiment is the same as that of the scanning electron microscope system 100 shown in FIG. 1 described in the first embodiment.

Since the flow of the present embodiment is the same except for the dimension measurement (S107) in the flowchart in the first embodiment of FIG. 9, only the dimension measurement (S107) will be described with reference to FIG. 15.

The dimension measurement is performed on the BSE signal waveform 1105 (see FIG. 11) extracted in the range 1104 between the position 1102 where the absolute value of the differential signal waveform 1101 is maximum and the position 1103 where it is zero using the dimension measurement conditions such as an input threshold.

In the BSE signal waveform 1105, a straight line 1503 connects a position 1500 on the BSE signal waveform where the differential signal waveform 1101 is maximum and a position 1501 on the BSE signal waveform where the differential signal waveform 1101 is minimum, a position internally divided by a threshold 1502 specified by the user is detected, and a distance 1504 between left and right positions is calculated. Since the extracted BSE signal waveform 1100 described above corresponds to the BSE signal of the side wall 203, according to the present embodiment, it is possible to measure the depth dimension at the same ratio as the threshold when the side wall angle is constant.

Fourth Embodiment

A fourth embodiment will describe an example of using a curve connecting a position corresponding to the top edge 207 where the signal change rate is maximum and a position corresponding to the bottom edge 208 where the signal is minimum instead of the BSE signal waveform in the dimension measurement described in the first embodiment.

A configuration of a scanning electron microscope system used in the fourth embodiment is the same as that of the scanning electron microscope system 100 shown in FIG. 1 described in the first embodiment.

Since the flow of the present embodiment is the same except for the dimension measurement (S107) in the flowchart in the first embodiment of FIG. 9, only the dimension measurement (S107) will be described with reference to FIG. 16.

The dimension measurement is performed on the BSE signal waveform 1105 (see FIG. 11) extracted in the range 1104 between the position 1102 where the absolute value of the differential signal waveform 1101 is maximum and the position 1103 where it is zero using the dimension measurement conditions such as an input threshold.

In the BSE signal waveform 1105, a curve 1620 connects a position 1600 on the BSE signal waveform where the differential signal waveform 1101 is maximum and a position 1601 on the BSE signal waveform where the differential signal waveform 1101 is minimum, a position internally divided by a threshold 1602 specified by the user is detected, and a distance 1604 between left and right positions is calculated. Here, calculation of the curve 1620 may be obtained by a polynomial approximation method, or may be obtained using a sigmoid function.

By using the fourth embodiment, since the influence of noise on the BSE signal waveform can be reduced as compared with the first embodiment, highly accurate dimension measurement can be performed.

Fifth Embodiment

A fifth embodiment shows a user interface for executing the embodiments of the invention. In order to automatically perform the measurement described in the first to fourth embodiments, it is necessary to create a recipe in which various conditions are specified in advance. In the recipe, in addition to a capturing condition setting box shown in FIG. 17, a BSE image of the measurement target shown in FIG. 10 and a display box of the dimension measurement region 1000 are displayed on a screen of the input and output unit 024.

A dimension measurement method selection box and a dimension measurement condition setting box for selecting dimension measurement methods described in the first to fourth embodiments shown in FIG. 18 are displayed on the screen of the input and output unit 024.

Further, a display box of a BSE signal waveform, a differential signal waveform and a side wall extraction region shown in FIG. 11, and a measurement result output box shown in FIG. 19 are displayed on the screen of the input and output unit 024.

According to the fifth embodiment, items requiring user input can be specified to execute the embodiments of the invention.

REFERENCE SIGN LIST 001 capturing optical system
021 control unit
022 calculation unit
023 storage unit
024 input and output unit
100 scanning electron microscope system
101 electron gun
102 primary electron beam
103 condenser lens
104 deflector
105 objective lens
106 scintillator
108 stage
110 BSE
111 optical fiber
112 photomultiplier tube
113 image generation unit
120 sample

The invention claimed is:

1. An electron microscope apparatus comprising:
a detector configured to detect reflected electrons reflected from a sample when the sample is irradiated with primary electrons emitted by an electron gun; and
a processor configured to
generate an image of a surface of the sample with the reflected electrons based on output from the detector;
generate a differential waveform signal of the generated image;
process the image using information of the differential waveform signal; and
measure a dimension of a pattern formed on the sample,
wherein the processor is further configured to process the image using information of a position at which the differential waveform signal is maximum, a position at which the differential waveform signal is minimum, and a position at which an absolute value of the differential waveform signal is minimum.

2. The electron microscope apparatus according to claim 1, further comprising:
an optical fiber connected to the detector, and a photomultiplier tube connected to the optical fiber and configured to detect the reflected electrons having an energy of 50 eV or more.

3. The electron microscope apparatus according to claim 1, wherein
the processor is further configured to obtain position information of an edge of the pattern formed on the sample using information of a position at which an absolute value of the differential signal waveform is maximum, and correct a distribution of luminance of the image using the obtained position information of the edge of the pattern.

4. The electron microscope apparatus according to claim 3, wherein
the processor is further configured to correct luminance of a flat portion of the surface of the sample in the image to be equal over the entire image by using the position information of the edge of the pattern formed on the sample.

5. An inspection system using an electron microscope apparatus, the electron microscope apparatus comprising:
a detector configured to detect reflected electrons reflected from a sample when the sample is irradiated with primary electrons emitted by an electron gun; and
a processor configured to
generate an image of a surface of the sample with the reflected electrons based on output from the detector;
generate a differential waveform signal of the generated image;
process the image using information of the differential waveform signal;
measure a dimension of a pattern formed on the sample;
receive an input condition to be processed and output a processed result;
determine quality of the dimension of the pattern formed on the sample by comparing the dimension of the pattern measured using the information of the differential waveform signal with a threshold value stored in advance;
output a result of the quality of the dimension of the pattern formed on the sample; and
process the image using information of a position at which the differential waveform signal is maximum, a position at which the differential waveform signal is minimum, and a position at which an absolute value of the differential waveform signal is minimum.

6. The inspection system using the electron microscope apparatus according to claim 5, further comprising:
an optical fiber connected to the detector, and a photomultiplier tube connected to the optical fiber and configured to detect the reflected electrons having an energy of 50 eV or more.

7. The inspection system using the electron microscope apparatus according to claim 5, wherein
the processor is further configured to obtain position information of an edge of the pattern formed on the sample using information of a position at which an absolute value of the differential signal waveform is maximum, and correct a distribution of luminance of the image using the obtained position information of the edge of the pattern.

8. The inspection system using the electron microscope apparatus according to claim 7, wherein
the processor is further configured to correct luminance of a flat portion of the surface of the sample in the image to be equal over the entire image by using the position information of the edge of the pattern formed on the sample.

* * * * *